(12) United States Patent
Groezinger et al.

(10) Patent No.: US 12,372,884 B2
(45) Date of Patent: Jul. 29, 2025

(54) DEVICE FOR POSITIONING AND HOLDING AT LEAST ONE OPTICAL ELEMENT, MEASUREMENT SYSTEM

(71) Applicant: CARL ZEISS SMT GMBH, Oberkochen (DE)

(72) Inventors: Thomas Groezinger, Steinheim (DE); Semih Oeztuerk, Schorndorf (DE); Erik Loopstra, Ederheim Huernheim (DE); Anton Haase, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 209 days.

(21) Appl. No.: 18/348,549

(22) Filed: Jul. 7, 2023

(65) Prior Publication Data

US 2023/0350311 A1    Nov. 2, 2023

Related U.S. Application Data

(63) Continuation of application No. PCT/EP2021/084412, filed on Dec. 6, 2021.

(30) Foreign Application Priority Data

Jan. 8, 2021 (DE) ............. 10 2021 200 094.0
Jan. 19, 2021 (DE) ............. 10 2021 200 453.9

(51) Int. Cl.
G02B 7/00 (2021.01)
G01N 21/33 (2006.01)
G03F 7/00 (2006.01)

(52) U.S. Cl.
CPC ......... *G03F 7/70825* (2013.01); *G01N 21/33* (2013.01); *G02B 7/005* (2013.01); *G03F 7/70258* (2013.01)

(58) Field of Classification Search
CPC . G03F 7/70825; G03F 7/70258; G01N 21/33; G02B 7/005; G02B 7/003; G02B 7/1822
See application file for complete search history.

(56) References Cited

U.S. PATENT DOCUMENTS

| 4,723,075 A | 2/1988 | German |
| 7,292,354 B2 | 11/2007 | Schraemmli et al. |

(Continued)

FOREIGN PATENT DOCUMENTS

| DE | 19807119 C1 | 6/1999 |
| DE | 10330581 A1 | 3/2004 |

(Continued)

OTHER PUBLICATIONS

International Search Report, PCT/EP2021/084412, Mar. 25, 2022, 4 pages.

(Continued)

*Primary Examiner* — Hung V Nguyen
(74) *Attorney, Agent, or Firm* — Edell, Shapiro & Finnan, LLC

(57) ABSTRACT

Provided for herein is a device that includes a first base support rotatable about a first rotational axis perpendicular to a rest surface of the first base support; a second base support arranged on the first base support and rotatable about a second rotational axis perpendicular to the rest surface of the first base support; at least one third base support arranged on the second base support and rotatable about a third rotational axis perpendicular to the rest surface of the first base support; and a supporting element is arranged on the third base support and including a holding surface for holding at least one optical element, the holding surface being rotatable about a rotational axis perpendicular to the holding surface.

9 Claims, 5 Drawing Sheets

(56) References Cited

U.S. PATENT DOCUMENTS

| | | | | |
|---|---|---|---|---|
| 7,420,752 B2 * | 9/2008 | Shibazaki | .............. | G02B 7/026 |
| | | | | 359/813 |
| 2021/0333720 A1 * | 10/2021 | Westover | ............ | G03F 7/70775 |

FOREIGN PATENT DOCUMENTS

| | | | |
|---|---|---|---|
| DE | 102015220817 | A1 | 12/2015 |
| DE | 102017209796 | A1 | 8/2017 |
| DE | 102018205163 | A1 | 8/2018 |
| EP | 1588855 | A1 | 10/2005 |

OTHER PUBLICATIONS

German Office Action with English translation, Application No. 10 2021 200 453.9, Aug. 24, 2021, 13 pages.

\* cited by examiner

DEVICE FOR POSITIONING AND HOLDING AT LEAST ONE OPTICAL ELEMENT, MEASUREMENT SYSTEM

CROSS-REFERENCE TO RELATED APPLICATION

This is a Continuation of International Application PCT/EP2021/084412, which has an international filing date of Dec. 6, 2021, and the disclosure of which is incorporated in its entirety into the present Continuation by reference. This Continuation also claims foreign priority under 35 U.S.C. § 119(a)-(d) to and also incorporates by reference, in their entirety, German Patent Application DE 10 2021 200 094.0 filed on Jan. 8, 2021, and German Application DE 10 2021 200 453.9 filed Jan. 19, 2021.

FIELD OF THE INVENTION

The disclosed techniques relate to a device for positioning and holding at least one optical element. The disclosed techniques further relate to a measurement system.

BACKGROUND

The disclosed techniques relate to a device for positioning and holding an optical element, in particular for use in semiconductor lithography and in particular for carrying out a measurement process. Modern projection exposure apparatuses for semiconductor lithography make use of projection light with extremely short wavelengths, in particular in the range of at least 5 nm and at most 20 nm. Projection exposure apparatuses using these wavelengths, which are known as EUV (extreme ultraviolet) projection exposure apparatuses, use mirrors to image an illuminated reflection mask, also known as a reticle, onto a semiconductor substrate, which is also known as a wafer, due to the fact that no refractive optical elements with a sufficient degree of transmission are available in the EUV wavelength range. The mirrors used in EUV projection exposure apparatuses may be designed as multilayer mirrors in which the optically active surface includes a sequence of several hundred thin layers with alternatingly different refractive indices. In the production of such multilayer mirrors, their optical properties, in particular their reflection properties, have to be measured. Devices or measurement systems used to make these measurements arrange the mirror to be measured in a vacuum chamber in which the mirrors are moved in different spatial directions. In the past, grease-free or oil-free bearings were used to arrange and move the mirrors in order to avoid contamination of the optically active surface of the mirror by particles of grease or oil, for example. However, with an increasing mass of the mirrors, e.g., masses around 500 kg, the considerable forces induced when moving the mirrors may lead to the bearings "seizing," extremely limiting the ability to move the mirrors being measured. In addition, the above-mentioned "seizing" usually leads to abrasion of particles and thus to the specifically undesired contamination of the optically active surface of the mirrors to be measured.

Document DE 10 2015 220 817 A1 discloses a device for positioning and holding at least one optical element, the device having a receiving device for the optical element, the receiving device being arranged on an upper part of an air bearing, and the upper part being rotatable about an axis of rotation and movable in a plane oriented perpendicular to the axis of rotation.

The publication EP 1 588 855 A1 describes a device for photoelectric measurement of a substantially planar measurement template, with a photoelectric measurement apparatus and a positioning device in the manner of a SCARA robot ("Selective Compliant Assembly Robot Arm") for guiding the measurement apparatus two-dimensionally over the measurement template arranged on a bearing surface and for positioning it at defined measurement points of the measurement template.

DE 10 2018 205 163 A1 describes a measurement system for measuring reflection properties of an optical element for electromagnetic radiation at different wavelengths in the extreme ultraviolet spectral range. The system comprises a radiation source for providing electromagnetic radiation in the extreme ultraviolet spectral range and a monochromator for adjusting the wavelength of a measurement beam directed onto the optical element. Furthermore, the system comprises a detector for detecting radiation reflected at the optical element. In addition, the system comprises a sample holder or positioning device. The latter holds the optical element and enables translation and rotation of the optical element to be measured in all three spatial directions in order to be able to carry out reflectivity measurements at different measurement points depending on the wavelength and on the angle of incidence.

A further measurement system is known from U.S. Pat. No. 4,723,075 A.

SUMMARY

It is an object of the disclosed techniques may be to provide an improved device or measurement system, for example, a device or measurement system having little wear and contamination.

This object may be achieved in accordance with the features of the example embodiments described herein.

According to the disclosed techniques, the device has the following components: a first main carrier, the first main carrier being rotatable about a first axis of rotation perpendicular to a bearing surface of the first main carrier, a second main carrier arranged on the first main carrier, the second main carrier being rotatable about a second axis of rotation perpendicular to the bearing surface of the first main carrier, at least one third main carrier arranged on the second main carrier, the third main carrier being rotatable about a third axis of rotation perpendicular to the bearing surface of the first main carrier, and a supporting element arranged on the third main carrier, the supporting element having a holding surface for holding at least one optical element, the holding surface being rotatable about an axis of rotation perpendicular to the holding surface. The axes of rotation are each defined by a pivot bearing, for example a ball bearing or plain bearing. Owing to the rotatably designed main carrier, in particular to the use of pivot bearings, abrasion or wear during operation of the device may be decreased or minimized when compared to related art techniques. In the case of lubricated, e.g., greased or oiled, pivot bearings, the service life and measurement accuracy of the device may be increased because, for example, contamination of a vacuum chamber in which the device is arranged during operation is reduced as a result of the minimized abrasion or wear. The use of pivot bearings may also provide for devices in which the particles which arise in the pivot bearing and lubricated pivot bearing components may be better shielded than, for example, the particles generated by linear bearings. Furthermore, from a geometrical aspect, a labyrinth seal may be implemented much more easily in a pivot bearing than on a linear axis or in a linear bearing. Such a labyrinth seal avoids contamination of the vacuum chamber with particles and/or grease.

According to the disclosed techniques, the supporting element and/or the holding surface is/are pivotable about a pivot axis which is at least substantially parallel to the bearing surface of the first main carrier. An advantage of such an arrangement may be an increase in the number of degrees of freedom in which the at least one optical element may be positioned or aligned.

According to the disclosed techniques, the supporting element and/or the holding surface is/are displaceable perpendicularly to the bearing surface of the first main carrier. An advantage of such an arrangement may be an increase in the number of degrees of freedom in which the at least one optical element can be positioned or aligned.

According to the disclosed techniques, the first, second and third axes of rotation are each arranged offset from one another with respect to a reference plane in a basic state. In other words: in the basic state, although the axes of rotation are arranged one above another, they are not arranged in a line. "Basic state" as used herein means that the first, second and third main carrier are in each case not rotated or each have an angle of rotation of zero degrees. An advantage of such an arrangement may be an increase in the number of degrees of freedom in which the at least one optical element can be positioned or aligned. In particular, such an arrangement may ensure that the at least one optical element can be positioned or aligned in a plurality of degrees of freedom, in particular in three translational and three rotational degrees of freedom.

According to one example, the first main carrier, the second main carrier, the third main carrier, the supporting element and/or the holding surface are designed to be controllable. An advantage of such a feature may be that the respective components can be rotated, pivoted and/or adjusted in height automatically and particularly precisely. Electrical or electronic drive elements or drive motors which are operatively connected to the first main carrier, the second main carrier, the third main carrier, the supporting element and/or the holding surface are preferably provided. The first main carrier, the second main carrier, the third main carrier, the supporting element and/or the holding surface are thus each controllable by a motor.

According to the disclosed techniques, the device may include a detector holding unit having a first detector main carrier, the first detector main carrier being rotatable about a first axis of rotation perpendicular to a bearing surface of the first detector main carrier, a second detector main carrier arranged on the first detector main carrier, the second detector main carrier being rotatable about a second axis of rotation perpendicular to the bearing surface of the first detector main carrier, at least one third detector main carrier arranged on the second detector main carrier, the third detector main carrier being rotatable about a third axis of rotation perpendicular to the bearing surface of the first detector main carrier, and a detector supporting element arranged on the third detector main carrier, the detector supporting element having a detector holding surface for holding at least one detector.

According to one example, the at least one optical element may have any desired or arbitrarily specifiable diameter and/or any desired or arbitrarily specifiable mass. The diameter is, for example and without being limited thereto, at least 0.01 cm, in particular 100 cm, and at most 3000 cm. The mass may be, for example and without being limited thereto, at most 2000 kg. An advantage of such features may be that the device is or can be designed specifically for measuring mirrors which are used for EUV lithography systems.

According to one example, the device is part of an EUV reflectometer. "EUV reflectometer" as used herein means a measurement system for measuring reflection properties of an optical element. Such an EUV reflectometer is configured in particular for detecting a reflectivity or a degree of reflection of the optical element at a multiplicity of wavelengths in a specified wavelength range of extreme ultraviolet (EUV) radiation. In particular, the EUV reflectometer is designed to detect a reflection spectrum over the specified wavelength range.

According to one example, the device has respective pivot bearings for implementing the respective axes of rotation, at least one of the pivot bearings being lubricated with a lubricant. The pivot bearings of the device are therefore lubricated with a lubricant, in particular greased or oiled, during operation of the device.

Furthermore, the disclosed techniques relate to a measurement system which has a device as described in the examples above for holding and positioning the at least one optical element.

Furthermore, the disclosed techniques relate to a detector holding unit for holding and positioning a detector for detecting an intensity of a light beam reflected by an optical element, the detector holding unit having a first detector main carrier, the first detector main carrier being rotatable about a first axis of rotation perpendicular to a bearing surface of the first detector main carrier, a second detector main carrier arranged on the first detector main carrier, the second detector main carrier being rotatable about a second axis of rotation perpendicular to the bearing surface of the first detector main carrier, at least one third detector main carrier arranged on the second detector main carrier, the third detector main carrier being rotatable about a third axis of rotation perpendicular to the bearing surface of the first detector main carrier, and a detector supporting element arranged on the third detector main carrier, the detector supporting element having a detector holding surface for holding at least one detector.

The detector holding unit is preferably part of an EUV reflectometer.

BRIEF DESCRIPTION OF THE DRAWINGS

The disclosed techniques will be explained in greater detail below with reference to the drawings, in which.

DETAILED DESCRIPTION

Figure 1:
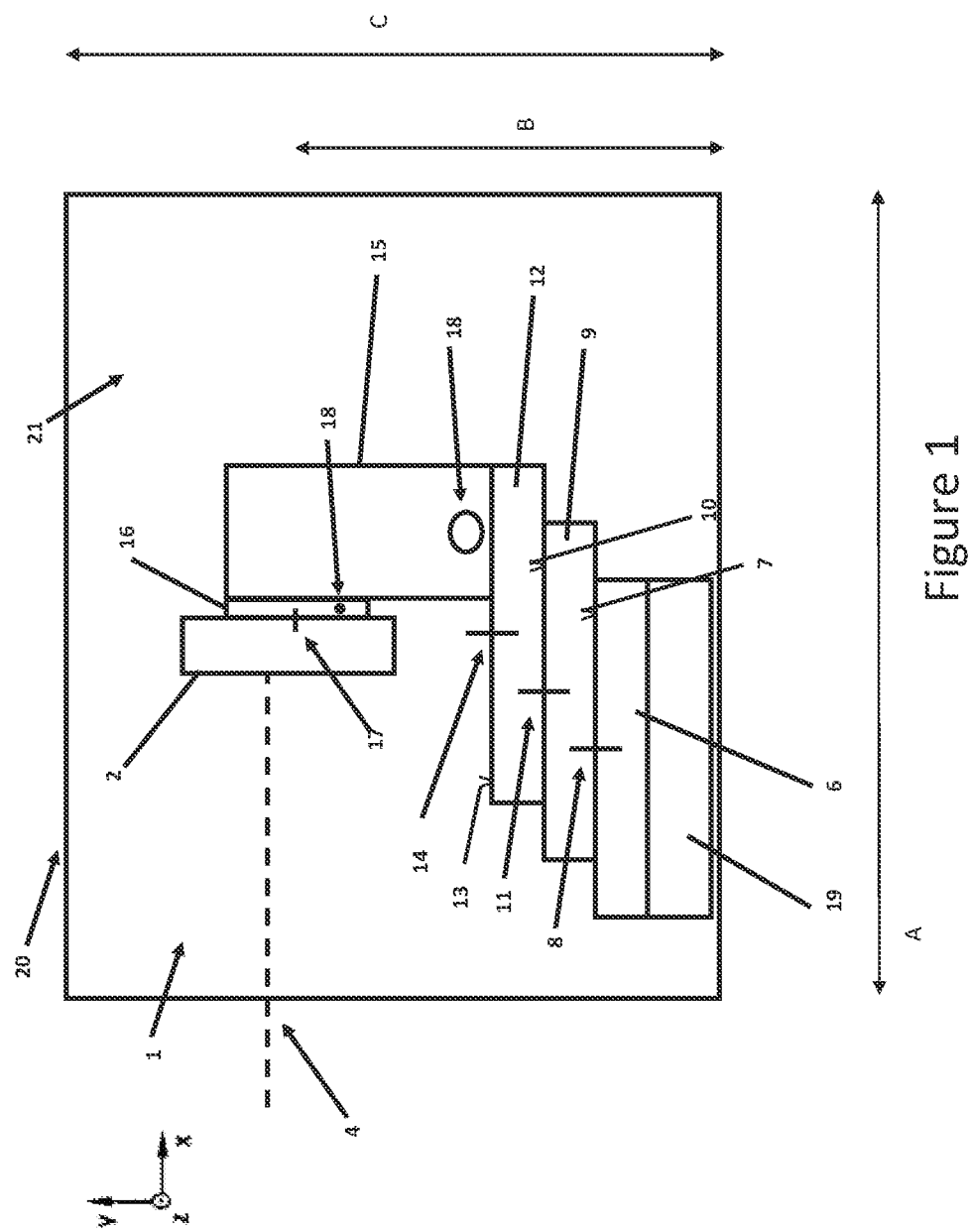
FIG. 1 shows a simplified side view of a device for positioning and holding at least one optical element according to an example embodiment.

For better illustration, the figures indicate a Cartesian, right-hand xyz coordinate system which reveals the respective positional relationship of the components illustrated in the figures. For example, in FIG. 1, the x direction runs to the right, the y direction upward and the z direction beyond the plane of the drawing perpendicular thereto.

FIG. 1 shows, in a highly simplified form, an exemplary embodiment of a device 1 for positioning and holding at least one optical element 2 to be measured. The optical element 2 may be embodied as a mirror, such as a mirror for an EUV lithography system (not illustrated here). The device 1 is preferably part of an EUV reflectometer, such as EUV reflectometer 3 illustrated in FIG. 4. "EUV reflectometer" as used herein refers to a measurement system for measuring reflection properties of the optical element 2 for electromagnetic radiation at wavelengths in the extreme ultraviolet spectral range.

The device 1 is configured, in particular, to hold the at least one optical element 2 to be measured and to position it in a plurality of degrees of freedom with respect to a measurement beam 4 (such as a measurement beam used in EUV reflectometer 3 of FIG. 4) such that the measurement beam 4 impinges on a reflective surface of the optical element 2 at a specifiable measurement point or a specifiable measurement location and at a specifiable angle of incidence or angle of incidence range.

The device 1 has a first main carrier 6 which is rotatable about a first axis of rotation 8 (Theta1 axis) perpendicular to a bearing surface 7 of the first main carrier 6. In the present example, the first axis of rotation is aligned in the y direction or parallel to the y direction. Furthermore, the device 1 has a second main carrier 9 arranged on the first main carrier 6, the second main carrier 9 being rotatable about a second axis of rotation 11 (Theta2 axis) perpendicular to the bearing surface 7 of the first main carrier 6 or about a second axis of rotation 11 (Theta2 axis) perpendicular to the bearing surface 10 of the second main carrier 9. In addition, the device 1 has at least one third main carrier 12 arranged on the second main carrier 9, the third main carrier 12 being rotatable about a third axis of rotation 14 (Theta3 axis) perpendicular to the bearing surface 7 of the first main carrier 6 or about a third axis of rotation 14 (Theta3 axis) perpendicular to the bearing surface 13 of the third main carrier.

The first axis of rotation 8, the second axis of rotation 11 and the third axis of rotation 14 are each aligned parallel to one another, i.e., are each aligned in the y direction according to the present exemplary embodiment.

With respect to a reference plane, in this case the xz plane, the first, second and third axes of rotation 8, 11, 14 are each arranged offset to one another in a basic state or a basic position of the device 1. In other words: although the axes of rotation 8, 11, 14 are arranged one above another in the basic state or in the basic position, as seen in the y direction, they are not arranged in a line, as seen in the y direction. "Basic state" or "basic position" as used herein means that the first, second and third main carriers are in each case not rotated or the respective angles of rotation Theta1, Theta2 and Theta3 are equal to zero degrees. This ensures, in particular, that rotating the second main carrier 9 and the third main carrier 12 enables the optical element 2 to be positioned in one plane, in this case the xz plane. In the present case and without being limited thereto, the device 1 is shown in the basic state or the basic position.

A supporting element 15 is arranged on the third main carrier 12, the supporting element 15 having a holding surface 16 for holding the optical element 2, the holding surface 16 being rotatable about an axis of rotation 17 (Rho axis) perpendicular to the holding surface 16.

Furthermore, the supporting element 15 and/or the holding surface 16 is/are pivotable about a pivot axis 18 (Phi axis) which is at least substantially parallel to the bearing surface 7 of the first main carrier 6. In the present case, the pivot axis indicated by way of example is aligned in the z direction, i.e., the optical element 2 is pivotable in the xy plane.

In addition, the supporting element 15 and/or the holding surface 16 is/are displaceable perpendicularly to the bearing surface 7 of the first main carrier 6 or parallel to the first axis of rotation 8, optionally to each of the axes of rotation 8, 11, 14. This ensures an alignment of the optical element 2 in the y direction, i.e., a height adjustment.

To displace the supporting element 15 and/or the holding surface 16 perpendicularly to the bearing surface 7 of the first main carrier 6 or parallel to the first axis of rotation 8, the supporting element 15 and/or the holding surface 16 can be raised or lowered by suitable features, for example by an adjustment element, not illustrated here, in the form of a height-adjustable platform. Optionally, the supporting element 15 and/or the holding surface 16 rests/rest on at least three lifting elements which are displaceable in the y direction, for example rods, which can each be actuated via, for example, a linear drive, not illustrated in the figure, such that a displacement in the y direction and in particular also a tilting movement about the pivot axis 18 may be implemented. Alternatively or optionally, a movement about the pivot axis 18 may be implemented via a rotation of a shaft which is aligned parallel to the pivot axis 18. In the present example and without being limited thereto, the shaft is spatially identical to the pivot axis 18.

In the present example and without being limited thereto, the device 1 is arranged on a base plate 19.

In the present example, the device 1 is arranged inside a vacuum chamber 21 which is enclosed by an air-tightly sealable housing 20 which can be evacuated with the aid of connected pumps. The vacuum chamber 21 preferably has a width A of at least 2000 mm and at most 5000 mm. The device 1 has a height B of at least 1800 mm to at most 2800 mm from the base plate 19 to the axis of rotation 17 or from a pivot bearing defining the axis of rotation 17. The vacuum chamber 21 preferably has a height C of at least 2800 mm and at most 3800 mm.

Figure 4:
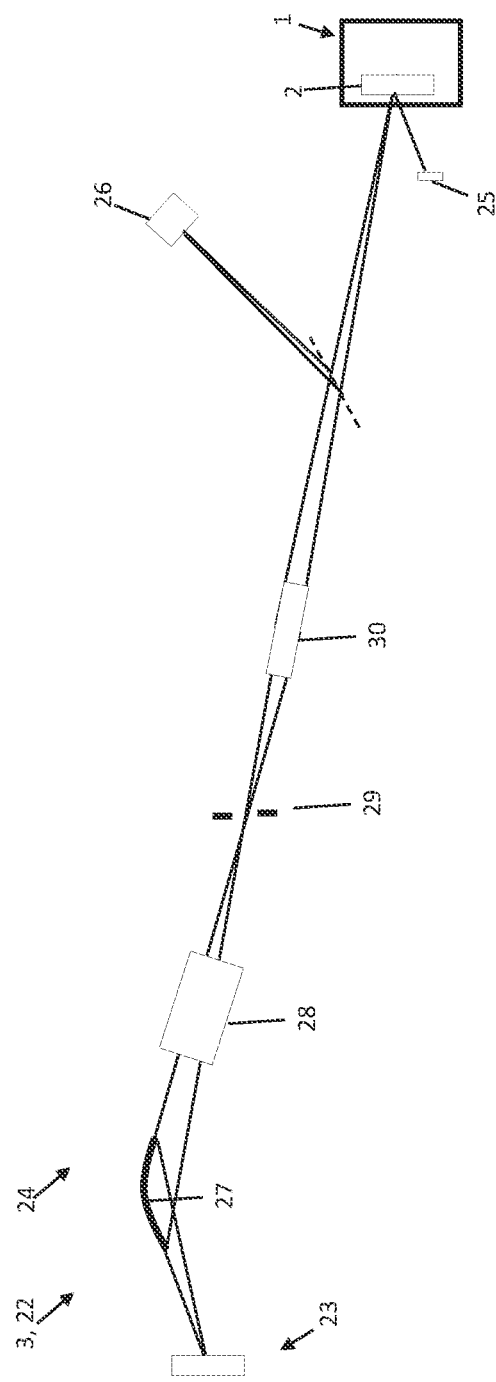
FIG. 4 shows an EUV reflectometer which includes the device, in a schematic plan view.

Alternatively, an EUV reflectometer 3 (as illustrated in FIG. 4) may be arranged together with the device 1 in the vacuum chamber 21.

Preferably, the first main carrier 6, the second main carrier 8, the third main carrier 12, the supporting element 15 and/or the holding surface 16 is/are designed to be controllable. Each of the components is preferably controllable separately via a respectively controllable drive element (not illustrated here), for example a drive motor.

The optical element 2 can have any desired or arbitrarily specifiable diameter and/or any desired or arbitrarily specifiable mass.

An advantage of the device 1 may be that the at least one optical element 2 can be positioned or aligned particularly precisely in six degrees of freedom, i.e., in three translational and three rotational degrees of freedom. In the present case, the axes of rotation 8, 11, 14 are each defined by pivot bearings, for example ball bearings or plain bearings. In other words: the device has pivot bearings for realizing the respective axes of rotation 8, 11, 14. The advantage of using pivot bearings is that, when the optical element 2 is positioned, the generation of contamination or particles, in particular as a result of friction, is minimized. This ensures a particularly advantageous measurement or reflectivity measurement of the optical element 2 that is minimized by the effects of contamination. In addition, the device 1 formed by pivot bearings can be operated in the vacuum chamber 21 in a particularly simple manner and with little contamination. A pivot bearing preferably has a labyrinth seal. Such a labyrinth seal avoids contamination of the vacuum chamber 21 with particles and grease. At least one or each of the pivot bearings is preferably lubricated with a lubricant, in particular greased or oiled.

Figure 2:
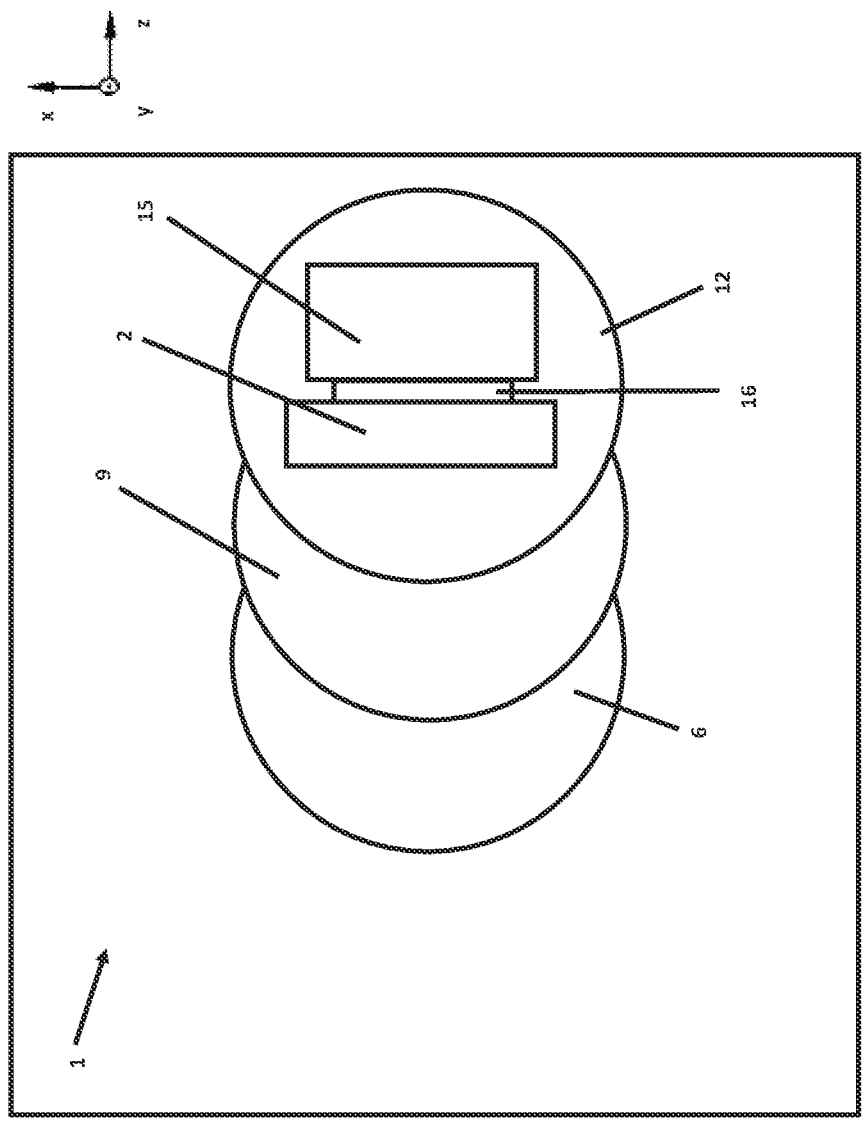
FIG. 2 shows the device in an example basic position in a schematic plan view, view.

FIG. 2 shows the device 1 in the basic state in a schematic plan view.

Figure 3:
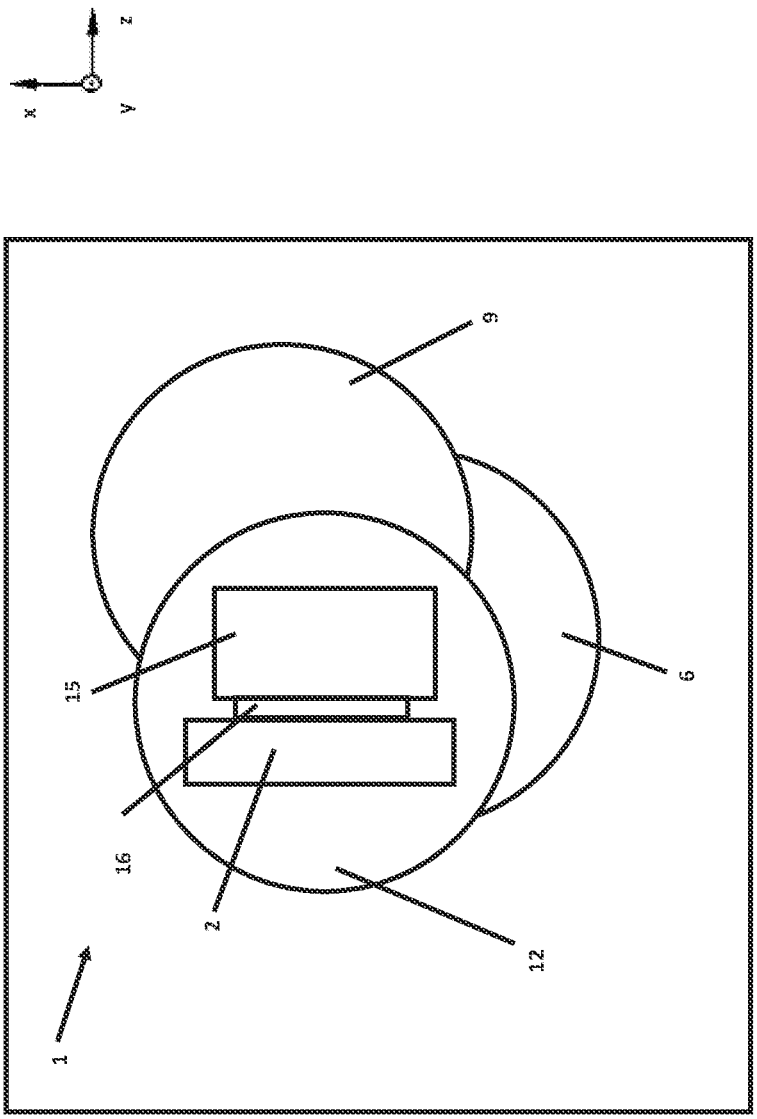
FIG. 3 shows the device in an example first alignment position in a schematic plan view.

FIG. 3 shows the device 1 in an exemplary first alignment position of the optical element 2 in a schematic plan view. A comparison with FIG. 2 shows that the optical element 2 can be positioned as desired in the xz plane by rotating the second main carrier 8 and the third main carrier 12. The optical element is additionally pivotable in the xy plane and adjustable in height in the y direction.

FIG. 4 shows a measurement system 22, in particular an EUV reflectometer 3, in a schematic plan view. The measurement system 22 or the EUV reflectometer 3 includes a radiation source 23 for electromagnetic radiation in the EUV spectral range, a monochromator 24 for setting or for selecting the wavelength of a measurement beam 4 directed at the at least one optical element 2, the device 1 for holding and positioning the optical element 2, a detector 25 for detecting an intensity of a light beam reflected by the optical element 2, and a reference detector 26 for detecting an intensity of the measurement beam 4 directed onto the optical element 2.

The radiation source 23 of this exemplary embodiment includes a pulsed laser, for example an Nd:YAG laser, the laser beam of which is focused onto a suitable target material by, for example a gold target, focusing optics (not illustrated). The laser beam generates a plasma on the surface of the target material, the plasma emitting a quasi-continuous spectrum of electromagnetic radiation in the EUV range. The plasma thus represents a source spot or emission spot for EUV radiation. A portion of the EUV radiation emitted by the source spot passes as a measurement beam 4 through an input stop (not illustrated here) as the entry opening of the monochromator 24. The monochromator 24 also has a first reflection element 27 arranged in the beam path of the measurement beam 4, a second reflection element 28 arranged in the beam path downstream of the first reflection element 27, an exit slit 29 arranged in the beam path downstream of the second reflection element 28, and a third reflection element 30 arranged in the beam path downstream of the exit slit 29. In the present example, the beam path of the measurement beam 4 runs from the radiation source 23 to the detector 25. The second reflection element 28 is preferably designed as a planar grating, optionally as a spherical grating.

The use of the device 1 illustrated in FIGS. 2-3 is not limited to the measurement system 22 illustrated here. Rather, the device 1 is also usable with other measurement systems or EUV reflectometers, in particular with other radiation sources and/or beamlines or beamline designs, as described in, for example, DE 10 2018 205 163 A1.

Alternatively, the EUV reflectometer 3 may be arranged together with the device 1 in the vacuum chamber 21.

A plurality of optical elements 2 are optionally arranged on the supporting element 15. The optical element 2 can optionally be a facet mirror, in particular for use in an EUV lithography system.

Figure 5:
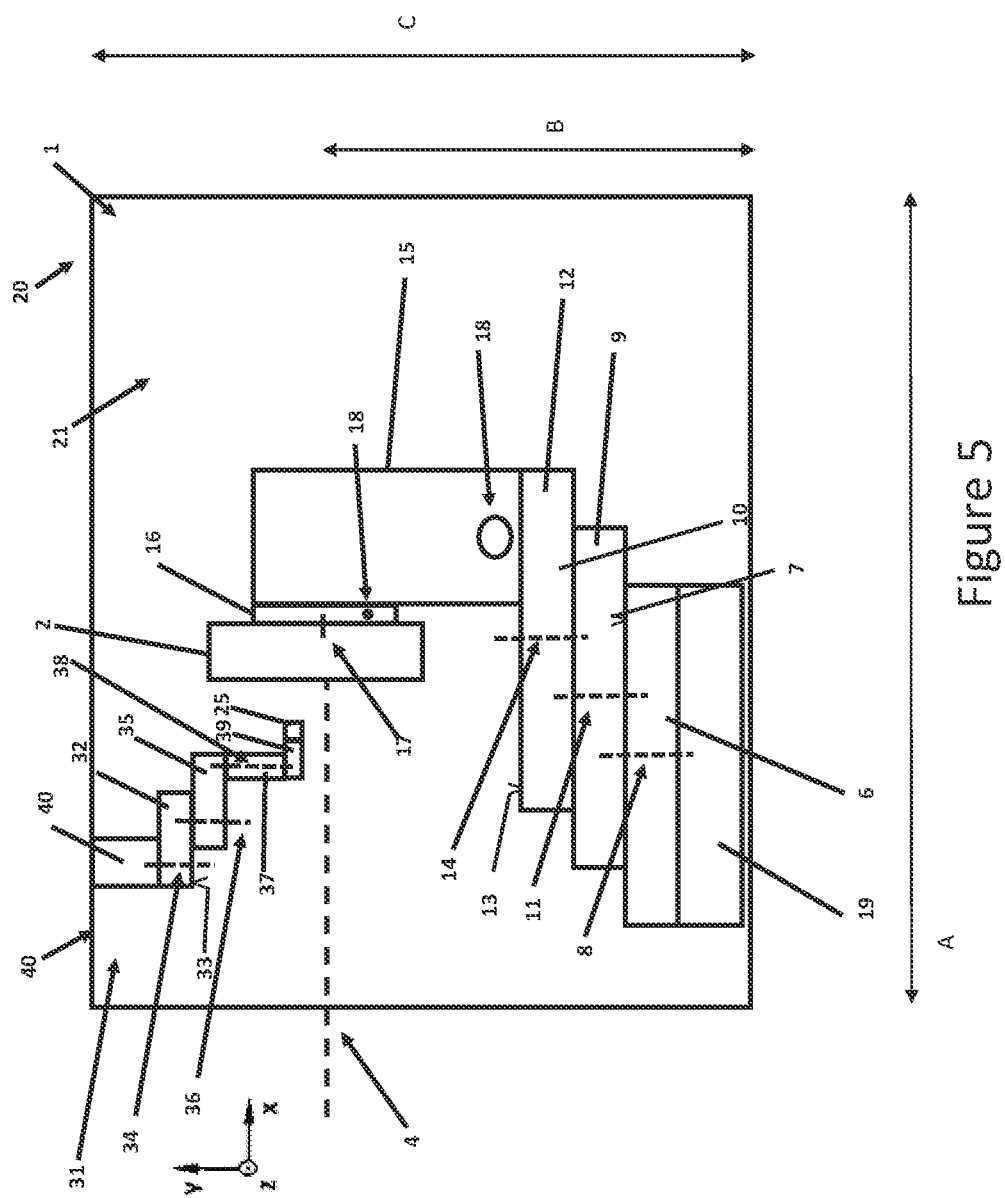
FIG. 5 shows a simplified side view of the device and a detector holding unit for holding and positioning a detector for detecting an intensity of a light beam reflected by an optical element according to an example embodiment.

FIG. 5 shows the device 1 from FIG. 1, wherein, according to the present exemplary embodiment, a detector holding unit 31 for holding and positioning the detector 25 for detecting an intensity of a light beam reflected by the optical element 2 is additionally illustrated.

The detector holding unit 31 has a first detector main carrier 32, the first detector main carrier 32 being rotatable about a first axis of rotation 34 perpendicular to a bearing surface 33 of the first detector main carrier 32, a second detector main carrier 35 arranged on the first detector main carrier 32, the second detector main carrier 35 being rotatable about a second axis of rotation 36 perpendicular to the bearing surface 33 of the first detector main carrier 32, at least one third detector main carrier 37 arranged on the second detector main carrier 35, the third detector main carrier 37 being rotatable about a third axis of rotation 38 perpendicular to the bearing surface 33 of the first detector main carrier 32, and a detector supporting element 39 arranged on the third detector main carrier 37 or operatively connected to the third detector main carrier 37, the detector supporting element 39 having a detector holding surface for holding the detector 25. Optionally, a plurality of detectors are arranged or can be arranged on the detector holding surface 39.

The third detector main carrier 37, the detector supporting element 39 and/or the detector holding surface is/are optionally displaceable perpendicularly to the bearing surface 33 of the first detector main carrier 32, i.e., in the present case in the y direction. This ensures that the detector 25 can be positioned in a specifiable manner in the y direction.

Optionally, the detector supporting element 39 and/or the detector holding surface is/are rotatable about a detector axis of rotation which is perpendicular to the detector holding surface and is not illustrated here.

The detector holding unit 31 is preferably arranged on an upper side 40 or ceiling side of the vacuum chamber 21.

In the present example, the detector 25 is movable as desired in the x, z and y directions by the detector holding unit 31. This ensures that the detector 25 can be aligned particularly precisely to a light beam reflected by the at least one optical element 2. Optionally, the detector 25 is pivotable and/or rotatable.

The use of the detector holding unit 31 is not limited to the device 1 illustrated here. Rather, the detector holding unit 31 is also usable with other or differently configured devices for positioning and holding at least one optical element. The detector holding unit 31 is preferably part of an EUV reflectometer 3, as illustrated in FIG. 4.

What is claimed is:

1. An apparatus comprising:
   a first main carrier rotatable about a first axis of rotation perpendicular to a bearing surface of the first main carrier,
   a second main carrier arranged on the first main carrier and rotatable about a second axis of rotation perpendicular to the bearing surface of the first main carrier,
   at least one third main carrier arranged on the second main carrier and rotatable about a third axis of rotation perpendicular to the bearing surface of the first main carrier, and
   a supporting element arranged on the at least one third main carrier, the supporting element comprising a holding surface configured to hold at least one optical element, the holding surface being rotatable about an axis of rotation perpendicular to the holding surface,
   wherein one or more of the supporting element or the holding surface is pivotable about a pivot axis which is at least substantially parallel to the bearing surface of the first main carrier, and wherein the first axis of rotation, second axis of rotation and third axis of rotation are each arranged offset from one another with respect to a specifiable reference plane in a basic state of the apparatus such that one or more of the supporting element or the holding surface is displaceable perpendicularly to the bearing surface of the first main carrier.

2. The apparatus of claim 1, wherein one more of the first main carrier, the second main carrier, the at least one third main carrier, the supporting element or the holding surface are designed to be controllable.

3. The apparatus of claim 1, further comprising a detector holding unit comprising:
- a first detector main carrier rotatable about a first axis of rotation perpendicular to a bearing surface of the first detector main carrier,
- a second detector main carrier arranged on the first detector main carrier and rotatable about a second axis of rotation perpendicular to the bearing surface of the first detector main carrier,
- at least one third detector main carrier arranged on the second detector main carrier, the at least one third detector main carrier being rotatable about a third axis of rotation perpendicular to the bearing surface of the first detector main carrier, and
- a detector supporting element arranged on the at least one third detector main carrier, the detector supporting element comprising a detector holding surface configured to hold at least one detector.

4. The apparatus of claim 1, wherein the apparatus is included in an EUV reflectometer.

5. The apparatus of claim 1, wherein the first axis of rotation comprises a first pivot bearing, the second axis of rotation comprises a second pivot bearing, and the third axis of rotation comprises a third pivot bearing, and wherein one or more of the first pivot bearing, the second pivot bearing or the third pivot bearing is lubricated with a lubricant.

6. A measurement system, comprising:
- a radiation source configured to provide electromagnetic radiation in the EUV spectral range,
- a monochromator configured to set or select a wavelength of a measurement beam directed onto at least one optical element,
- at least one detector configured to detect an intensity of a light beam reflected by the at least one optical element,
- a reference detector configured to detect an intensity of the measurement beam directed onto the at least one optical element, and
- an apparatus as claimed in claim 1 configured to hold and position the at least one optical element.

7. A detector holding unit configured to hold and position a detector for detecting an intensity of a light beam reflected by an optical element, comprising:
- a first detector main carrier rotatable about a first axis of rotation perpendicular to a bearing surface of the first detector main carrier,
- a second detector main carrier arranged on the first detector main carrier and rotatable about a second axis of rotation perpendicular to the bearing surface of the first detector main carrier,
- at least one third detector main carrier arranged on the second detector main carrier, the at least one third detector main carrier being rotatable about a third axis of rotation perpendicular to the bearing surface of the first detector main carrier, and
- a detector supporting element arranged on the at least one third detector main carrier, the detector supporting element comprising a detector holding surface configured to hold at least one detector.

8. The detector holding unit of claim 7, wherein the optical element comprises a mirror configured to reflect radiation in EUV spectral range.

9. The detector holding unit of claim 7, wherein the detector holding unit is included in an EUV reflectometer.

* * * * *